US006625048B2

(12) United States Patent
Adedifard (10) Patent No.: US 6,625,048 B2
(45) Date of Patent: Sep. 23, 2003

(54) ARCHITECTURE, PACKAGE ORIENTATION AND ASSEMBLY OF MEMORY DEVICES

(75) Inventor: Ebrahim Adedifard, Sunnyvale, CA (US)

(73) Assignee: Micro Technology, Inc., Boise, ID (US)

( * ) Notice: Subject to any disclaimer, the term of this patent is extended or adjusted under 35 U.S.C. 154(b) by 0 days.

(21) Appl. No.: 10/200,921

(22) Filed: Jul. 23, 2002

(65) Prior Publication Data

US 2002/0181314 A1 Dec. 5, 2002

Related U.S. Application Data

(62) Division of application No. 09/642,683, filed on Aug. 21, 2000, now Pat. No. 6,445,603.

(51) Int. Cl.[7] .................................................. G11C 5/02
(52) U.S. Cl. .......................... 365/51; 365/63; 257/666; 257/672
(58) Field of Search ...................... 365/51, 63; 257/666, 257/672

(56) References Cited

U.S. PATENT DOCUMENTS

| | | | |
|---|---|---|---|
| 5,041,886 A | | 8/1991 | Lee |
| 5,332,922 A | * | 7/1994 | Oguchi et al. ............... 257/723 |
| 5,537,354 A | | 7/1996 | Mochizuki et al. |
| 5,600,605 A | | 2/1997 | Schaefer |
| 5,666,321 A | | 9/1997 | Schaefer |
| 5,751,039 A | | 5/1998 | Kauffman et al. |
| 5,787,457 A | | 7/1998 | Miller et al. |
| 5,880,987 A | | 3/1999 | Merritt |
| 5,907,186 A | | 5/1999 | Kang et al. |
| 5,936,903 A | | 8/1999 | Jeng et al. |
| 5,955,777 A | | 9/1999 | Corisis et al. |
| 5,995,438 A | | 11/1999 | Jeng et al. |
| 6,026,465 A | | 2/2000 | Mills et al. |
| 6,083,777 A | | 7/2000 | King et al. |
| 6,097,081 A | | 8/2000 | Masuda et al. |
| 6,107,677 A | | 8/2000 | Schoenfeld et al. |
| 6,114,751 A | | 9/2000 | Kumakura et al. |
| 6,130,114 A | | 10/2000 | Murakami et al. |
| 6,137,133 A | | 10/2000 | Kauffman et al. |
| 6,141,247 A | | 10/2000 | Roohparvar et al. |
| 6,148,509 A | | 11/2000 | Schoenfeld et al. |
| 6,392,292 B1 | * | 5/2002 | Morishita .................... 257/686 |

OTHER PUBLICATIONS

Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.

Micron, "16 Mb: x16 SDRAM" *Synchronous DRAM*, www.micron.com, copyright 1999 Micron Technology, Inc., pp. 1–51.

* cited by examiner

*Primary Examiner*—Van Thu Nguyen
(74) *Attorney, Agent, or Firm*—Leffert Jay & Polglaze PA; Thomas W. Leffert (57) ABSTRACT

Memory chips containing multiple-bank memory devices are arranged to be mounted in a memory package with the major axis of the memory chip aligned substantially parallel with the major axis of its memory package. Memory devices of various embodiments contain banks of non-volatile flash memory cells and have access commands synchronized to a system clock. Data chip bond pads for coupling to data pins of a memory package are located in a first quadrant of the memory chip. Address chip bond pads for coupling to address pins of a memory package are located in an opposite quadrant of the memory chip.

14 Claims, 6 Drawing Sheets

| Left | Pin | | Pin | Right |
|---|---|---|---|---|
| Vcc | 1* | | 54 | Vss |
| DQ0 | 2 | | 53 | DQ15 |
| VccQ | 3 | | 52 | VssQ |
| DQ1 | 4 | | 51 | DQ14 |
| DQ2 | 5 | | 50 | DQ13 |
| VssQ | 6 | | 49 | VccQ |
| DQ3 | 7 | | 48 | DQ12 |
| DQ4 | 8 | | 47 | DQ11 |
| VccQ | 9 | | 46 | VssQ |
| DQ5 | 10 | 150 | 45 | DQ10 |
| DQ6 | 11 | | 44 | DQ9 |
| VssQ | 12 | | 43 | VccQ |
| DQ7 | 13 | | 42 | DQ8 |
| Vcc | 14 | | 41 | Vss |
| DQML | 15 | | 40 | RP# |
| WE# | 16 | | 39 | DQMH |
| CAS# | 17 | | 38 | CLK |
| RAS# | 18 | | 37 | CKE |
| CS# | 19 | | 36 | VccP |
| BA0 | 20 | | 35 | A11 |
| BA1 | 21 | | 34 | A9 |
| A10 | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

ARCHITECTURE, PACKAGE ORIENTATION AND ASSEMBLY OF MEMORY DEVICES

RELATED APPLICATION

This is a divisional application of U.S. patent application Ser. No. 09/642,683, filed Aug. 21, 2000, now U.S. Pat. No. 6,445,603 titled "ARCHITECTURE, PACKAGE ORIENTATION AND ASSEMBLY OF MEMORY DEVICES," and commonly assigned, the entire contents of which are incorporated herein by reference.

TECHNICAL FIELD OF THE INVENTION

The present invention relates generally to semiconductor memory devices, and in particular, the present invention relates to an architecture, package orientation and assembly of semiconductor memory devices.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Asynchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

Figure 1A:
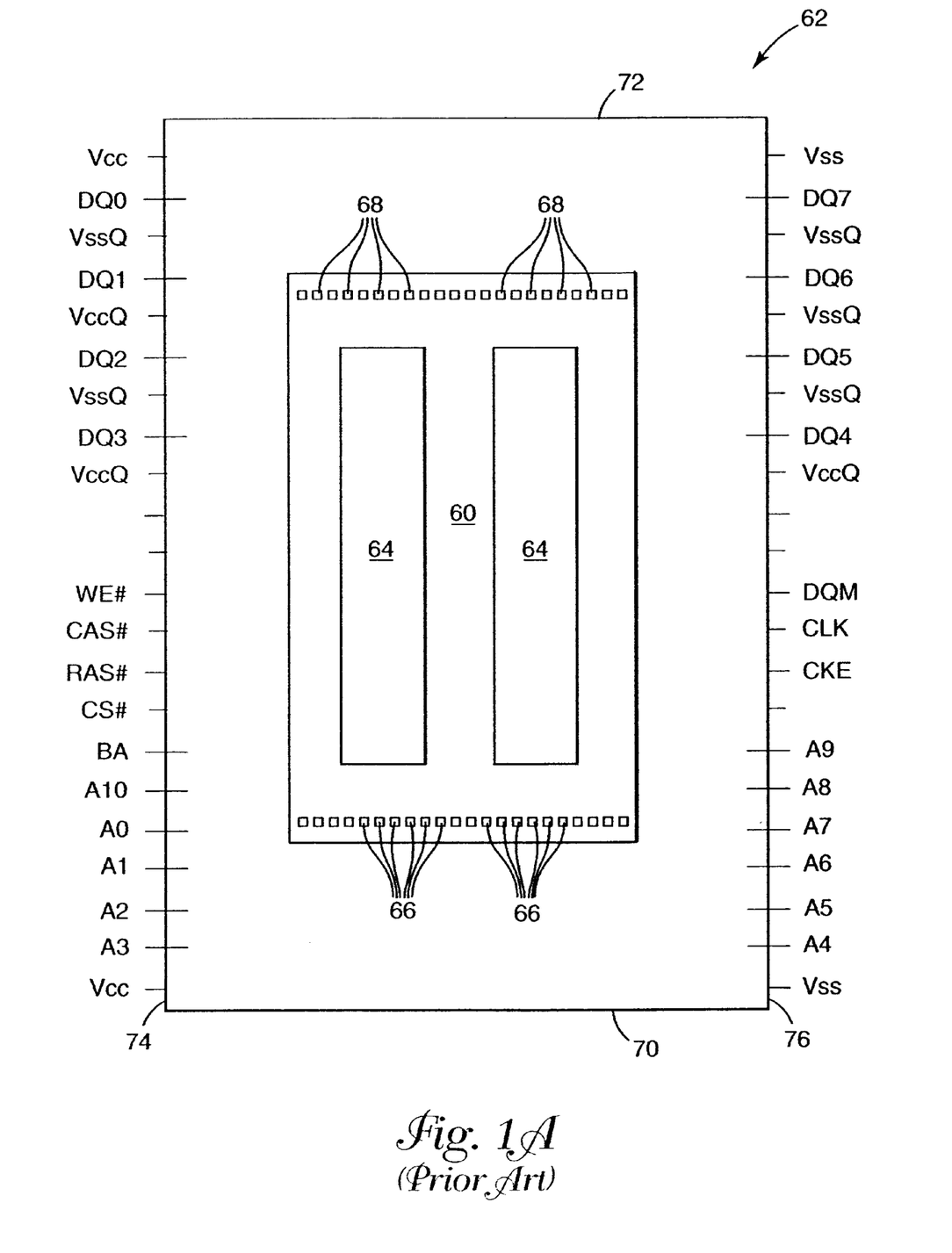
FIG. 1A is a schematic of one known memory assembly having a lengthwise orientation.
Figure 1B:
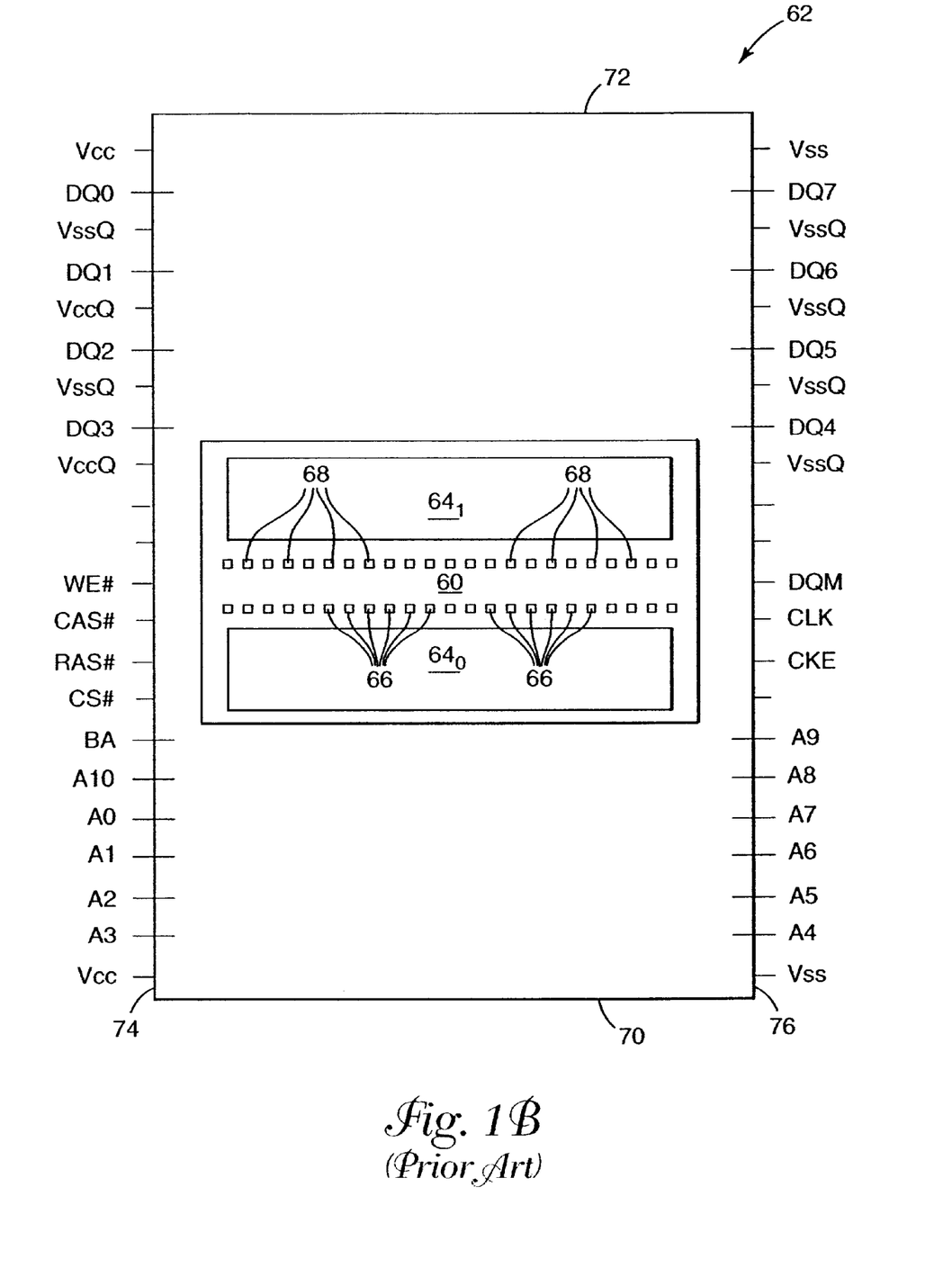
FIG. 1B is a schematic of another known memory assembly having an orthogonal orientation.

Many SDRAM devices are housed in packages that have an industry-standard pin layout and are of specified lengths and widths, such as a TSOP (thin, small-outline package) having a width of about 400 mils and a length dependent upon the number of pins. Memory chips in known TSOP memory packages have been oriented lengthwise within the package, as illustrated in FIG. 1A, and orthogonally within the package, as illustrated in FIG. 1B. FIGS. 1A and 1B depict industry-standard pin layouts for 44-pin SDRAM TSOP packages.

In the assembly depicted in FIG. 1A, memory chip 60 is oriented lengthwise within the package 62 with the major axis of the memory chip 60 extending substantially parallel to the major axis of the package 62. In the memory chip 60 of FIG. 1A, chip bond pads are located at opposite ends of the memory chip 60. An end will be referred to as opposite another end when the ends are separated by the minor axis. Address chip bond pads 66 are located at a first end of memory chip 60 while data chip bond pads 68 are located at a second end of memory chip 60. The address chip bond pads 66 are connected to the address pins A0–A10 and BA of the package 62 in a conventional manner. The data chip bond pads 68 are connected to the data pins DQ0–DQ7 in a conventional manner. To simplify the drawings, remaining chip bond pads, such as clock and control signal chip bond pads CLK, CKE, DQM, RAS#, CAS#, WE# and CS#, and power input chip bond pads VCC, VSS, VCCQ and VSSQ, are not labeled in FIG. 1A.

As shown in FIG. 1A, the address chip bond pads 66 of memory chip 60 are located adjacent the address pins A0–A10 near one end 70 of the package 62, with some of the address pins located at one side 74 of the package 62 and the remaining address pins located at the other, opposite side 76 of the package 62. A side will be referred to as opposite another side when the sides are separated by the major axis. The data chip bond pads 68 are located adjacent the data pins DQ0–DQ7 near one end 72 of the package 62, with some of the data pins located at one side 74 of the package 62 and the remaining data pins located at the other, opposite side 76 of the package 62.

In the assembly depicted in FIG. 1B, memory chip 60 is oriented orthogonally within the package 62 with the major axis of the memory chip 60 extending substantially perpendicular to the major axis of the package 62. In the memory chip 60 of FIG. 1B, chip bond pads are located between the banks of memory arrays, or memory banks 64, located on memory chip 60. Address chip bond pads 66 are located adjacent a first memory bank $64_0$ while data chip bond pads 68 are located a adjacent a second memory bank $64_1$. The address chip bond pads 66 are connected to the address pins A0–A10 and BA of the package 62 in a conventional manner. The data chip bond pads 68 are connected to the data pins DQ0–DQ7 in a conventional manner. To simplify the drawings, remaining chip bond pads, such as clock and control signal chip bond pads CLK, CKE, DQM, RAS#, CAS#, WE# and CS#, and power input chip bond pads VCC, VSS, VCCQ and VSSQ, are not labeled in FIG. 1B.

As shown in FIG. 1B, the address chip bond pads 66 of memory chip 60 are located adjacent the address pins A0–A10 near one end 70 of the package 62, with some of the address pins located at one side 74 of the package 62 and the remaining address pins located at the other, opposite side 76 of the package 62. Likewise, the data chip bond pads 68 are located adjacent the data pins DQ0–DQ7 near one end 72 of the package 62, with some of the data pins located at one side 74 of the package 62 and the remaining data pins located at the other, opposite side 76 of the package 62.

Undesirable propagation delays may be introduced in a memory assembly between the memory device and the address pins or data pins of the memory package as a result of high RC (resistive/capacitive) time constants between chip bond pads and their associated circuitry. Placement of the chip bond pads thus generally limits placement of the access circuitry. As memory devices become larger, thus containing larger arrays and/or more memory banks, these considerations become more critical.

For the reasons stated above, and for other reasons stated below which will become apparent to those skilled in the art upon reading and understanding the present specification, there is a need in the art for alternate architecture and assembly of semiconductor memory devices.

SUMMARY OF THE INVENTION

The above-mentioned problems with memory devices and other problems are addressed by the present invention and will be understood by reading and studying the following specification.

The invention includes memory assemblies and their components having memory chips with data chip bond pads and address chip bond pads segregated in opposite quadrants of the memory chips. Various embodiments include flash memory assemblies containing non-volatile flash memory cells and synchronous flash memory assemblies containing non-volatile flash memory cells and having access commands synchronized to a system clock.

For one embodiment, the invention provides a memory chip. The memory chip includes a plurality of memory banks having a major axis substantially parallel with a first side of the memory chip. The memory chip further includes data chip bond pads located adjacent the first side of the memory chip in a first quadrant of the memory chip. Each data chip bond pad of the memory chip is located in the first quadrant of the memory chip. The memory chip still further includes address chip bond pads located adjacent a side of the memory chip opposite the first side and in a quadrant of the memory chip opposite the first quadrant. Each address chip bond pad of the memory chip is located in the quadrant of the memory chip opposite the first quadrant. Thus, for such embodiments, data chip bond pads and address chip bond pads occupy only two, opposite quadrants of the memory chip.

For another embodiment, the invention provides a memory chip. The memory chip includes a multiple-bank memory array having a major axis substantially parallel with a first side of the memory chip. The banks of the memory array have the same orientation and the input/output gating circuitry for each bank is located adjacent the first side of the memory chip. Data chip bond pads for the memory chip are interposed between the input/output gating circuitry and the first side of the memory chip in a first quadrant of the memory chip. The address chip bond pads are located adjacent a side of the memory chip opposite the first side and in a quadrant of the memory chip opposite the first quadrant.

For yet another embodiment, the invention provides a memory chip. The memory chip includes a substrate having a memory device fabricated thereon. The memory device includes memory banks having address inputs and data inputs/outputs. A first row of chip bond pads is fabricated on the substrate in a first end and on a first side of the memory chip. A second row of chip bond pads is fabricated on the substrate in a second end of the memory chip opposite the first end and on a second side of the memory chip opposite the first side. Each of the data inputs/outputs is coupled to a chip bond pad in the first row of chip bond pads. Furthermore, each of the address inputs is coupled to a chip bond pad in the second row of chip bond pads.

For a further embodiment, the invention provides a lead-over-chip leadframe. The leadframe includes a first plurality of leads extending from a first side of the leadframe and originating in a first quadrant of the leadframe, wherein the first plurality of leads terminates in the first quadrant of the leadframe. The leadframe further includes a second plurality of leads extending from the first side of the leadframe and originating in a second quadrant of the leadframe, wherein the second plurality of leads terminates in a third quadrant of the leadframe. The leadframe still further includes a third plurality of leads extending from a second side of the leadframe and originating in the third quadrant of the leadframe, wherein the third plurality of leads terminates in the third quadrant of the leadframe. The leadframe still further includes a fourth plurality of leads extending from the second side of the leadframe and originating in a fourth quadrant of the leadframe, wherein the fourth plurality of leads terminates in the first quadrant of the leadframe.

For a still further embodiment, the invention provides a memory assembly. The memory assembly includes a memory package having a plurality of interconnect pins, wherein the plurality of interconnect pins comprises a first plurality of data pins located on a first side of the memory package, a second plurality of data pins located on a second side of the memory package, a first plurality of address pins located on the first side of the memory package, and a second plurality of address pins located on the second side of the memory package. The memory assembly further includes a lead-over-chip leadframe having a plurality of leads coupled to the plurality of interconnect pins in a one-to-one relationship. The memory assembly still further includes a memory chip. The memory chip includes a plurality of memory banks having a major axis substantially parallel with a first side of the memory chip. Each of the plurality of memory banks has the same orientation and each of the plurality of memory banks has input/output gating circuitry located adjacent the first side of the memory chip. The memory chip further includes a first plurality of data chip bond pads interposed between the input/output gating circuitry and the first side of the memory chip in a first quadrant of the memory chip, a second plurality of data chip bond pads interposed between the input/output gating circuitry and the first side of the memory chip in the first quadrant of the memory chip, a first plurality of address chip bond pads located adjacent a side of the memory chip opposite the first side and in a quadrant of the memory chip opposite the first quadrant, and a second plurality of address chip bond pads located adjacent the side of the memory chip opposite the first side and in the quadrant of the memory chip opposite the first quadrant. The first plurality of data chip bond pads is coupled to the first plurality of data pins through leads of the leadframe, the second plurality of data chip bond pads is coupled to the second plurality of data pins through leads of the leadframe, the first plurality of address chip bond pads is coupled to the first plurality of address pins through leads of the leadframe, and the second plurality of address chip bond pads is coupled to the second plurality of address pins through leads of the leadframe.

For one embodiment, the invention provides a synchronous flash memory chip. The memory chip includes a plurality of memory banks containing non-volatile flash memory cells. The plurality of memory banks may have the same orientation such that each of the plurality of memory banks has input/output gating circuitry located adjacent a first side of the memory chip. The memory chip further includes a command execution logic coupled to the plurality of memory banks for receiving a system clock input signal and for generating commands to control operations performed on the plurality of memory banks. The commands are synchronized to the system clock input signal. The memory chip further includes a plurality of data inputs/outputs coupled to the plurality of memory banks, a plurality of address inputs coupled to the plurality of memory banks, a plurality of data chip bond pads coupled to the plurality of data inputs/outputs, and a plurality of address chip bond pads coupled to the plurality of address inputs. The plurality of data chip bond pads are located adjacent the first side of the memory chip in a first quadrant of the memory chip. The plurality of address chip bond pads is located adjacent a second side of the memory chip opposite the first side and in a third quadrant of the memory chip opposite the first quadrant.

For yet another embodiment, the invention provides a synchronous flash memory assembly. The memory assembly includes a memory package having a plurality of interconnect pins having a pin layout substantially similar to an industry-standard SDRAM layout, a lead-over-chip leadframe having a plurality of leads coupled to the plurality of interconnect pins in a one-to-one relationship, and a synchronous flash memory chip. The memory chip includes a plurality of memory banks containing non-volatile flash memory cells, wherein the plurality of memory banks may have the same orientation such that each of the plurality of memory banks has input/output gating circuitry located adjacent a first side of the memory chip. The memory chip further includes a command execution logic coupled to the plurality of memory banks for receiving a system clock input signal and for generating commands to control operations performed on the plurality of memory banks, wherein the commands are synchronized to the system clock input signal. The memory chip further includes a plurality of data inputs/outputs coupled to the plurality of memory banks, a plurality of address inputs coupled to the plurality of memory banks, a plurality of data chip bond pads coupled to the plurality of data inputs/outputs, and a plurality of address chip bond pads coupled to the plurality of address inputs. The data chip bond pads are located adjacent the first side of the memory chip in a first quadrant of the memory chip. The address chip bond pads are located adjacent a second side of the memory chip opposite the first side and in a third quadrant of the memory chip opposite the first quadrant. A first portion of the plurality of data chip bond pads is coupled to data pins of a first side of the memory package through leads of the leadframe. A remaining portion of the plurality of data chip bond pads is coupled to data pins of a second side of the memory package through leads of the leadframe. A first portion of the plurality of address chip bond pads is coupled to address pins of the first side of the memory package through leads of the leadframe. A remaining portion of the plurality of address chip bond pads is coupled to address pins of the second side of the memory package through leads of the leadframe.

The invention further provides memory chips, leadframes and assemblies of various scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 2:
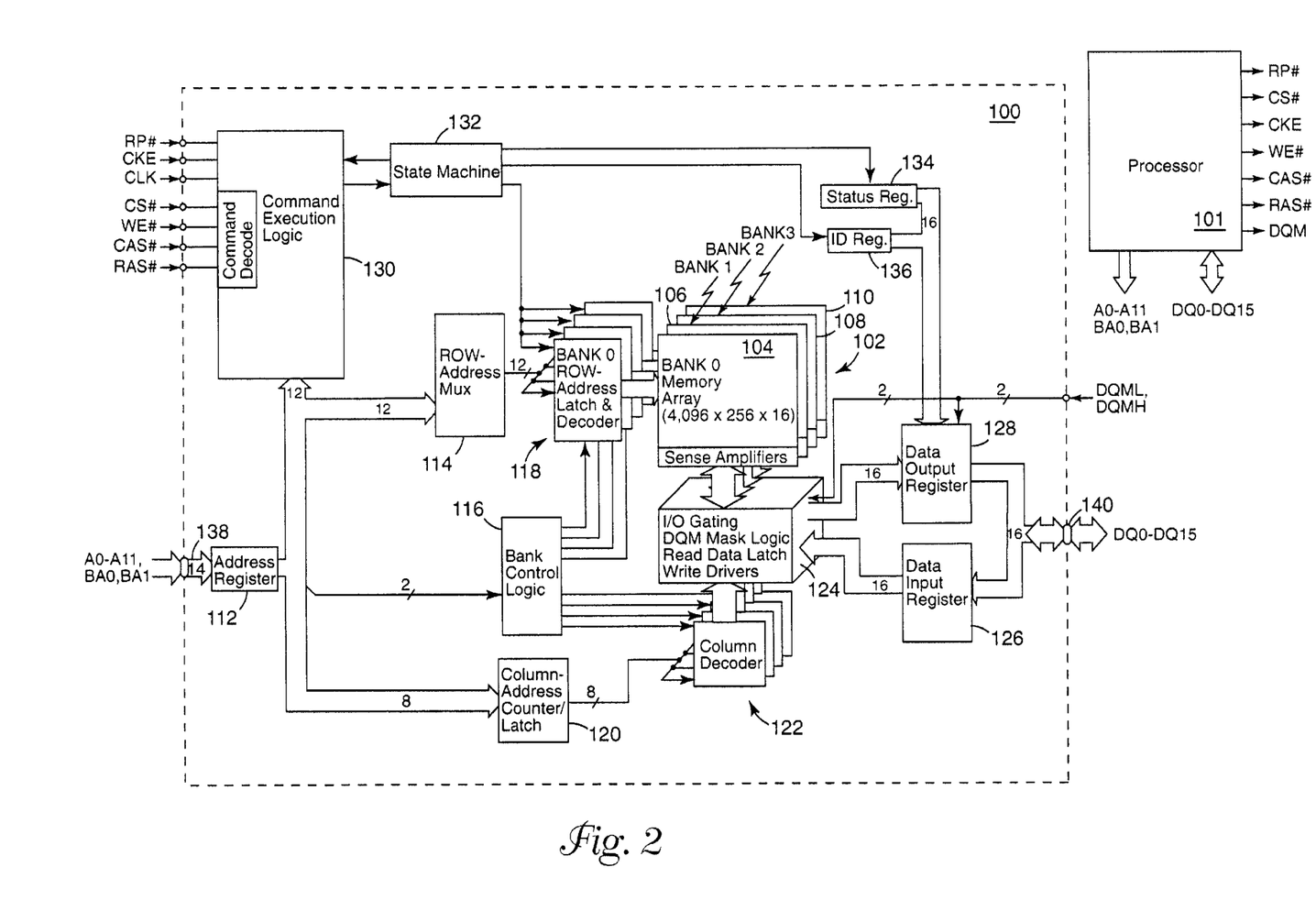
FIG. 2 is a block diagram of a memory device in accordance with the invention.

Referring to FIG. 2, a block diagram of one embodiment of the present invention is described. The memory device 100 includes an array of non-volatile flash memory cells 102. All access commands of the memory device 100 are synchronized to a system clock input signal (CLK), thus the memory device 100 may be referred to as a synchronous flash memory device. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 2 may be fabricated on a substrate, such as a semiconductor die, and may be referred to as a memory chip.

Figure 3:
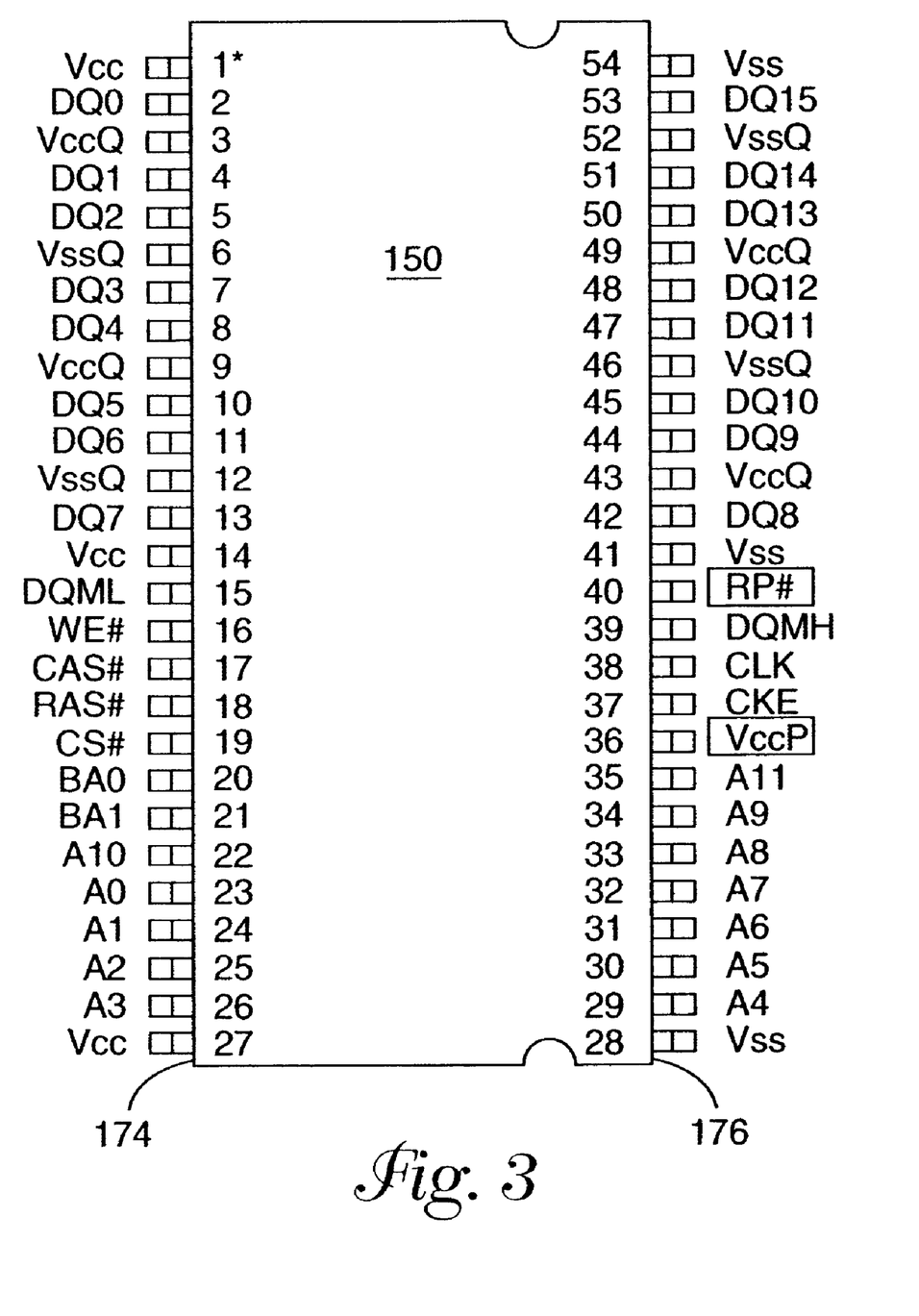
FIG. 3 is a top view of a memory assembly showing a package pin interconnect diagram in accordance with the invention.

FIG. 3 illustrates an interconnect pin assignment of one embodiment of the present invention as a memory assembly having a pin layout substantially similar to a standard SDRAM 54-pin TSOP package. Accordingly, the memory assembly has a memory package 150 having 54 interconnect pins. The memory package 150 contains a memory chip (not shown) in accordance with the invention. As such, the memory package 150 may contain a synchronous flash memory device. Two interconnects shown in the embodiment of FIG. 3 and not present in standard SDRAM packages include control signal RP# and power input VCCP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned. Furthermore, the invention is not limited to memory packages having pin layouts substantially similar to an industry-standard SDRAM pin layout, but is applicable to other memory packages having all address pins grouped toward one end of the package and all data pins grouped toward the other end such that each group of address pins is segregated from each group of data pins.

Figure 4:
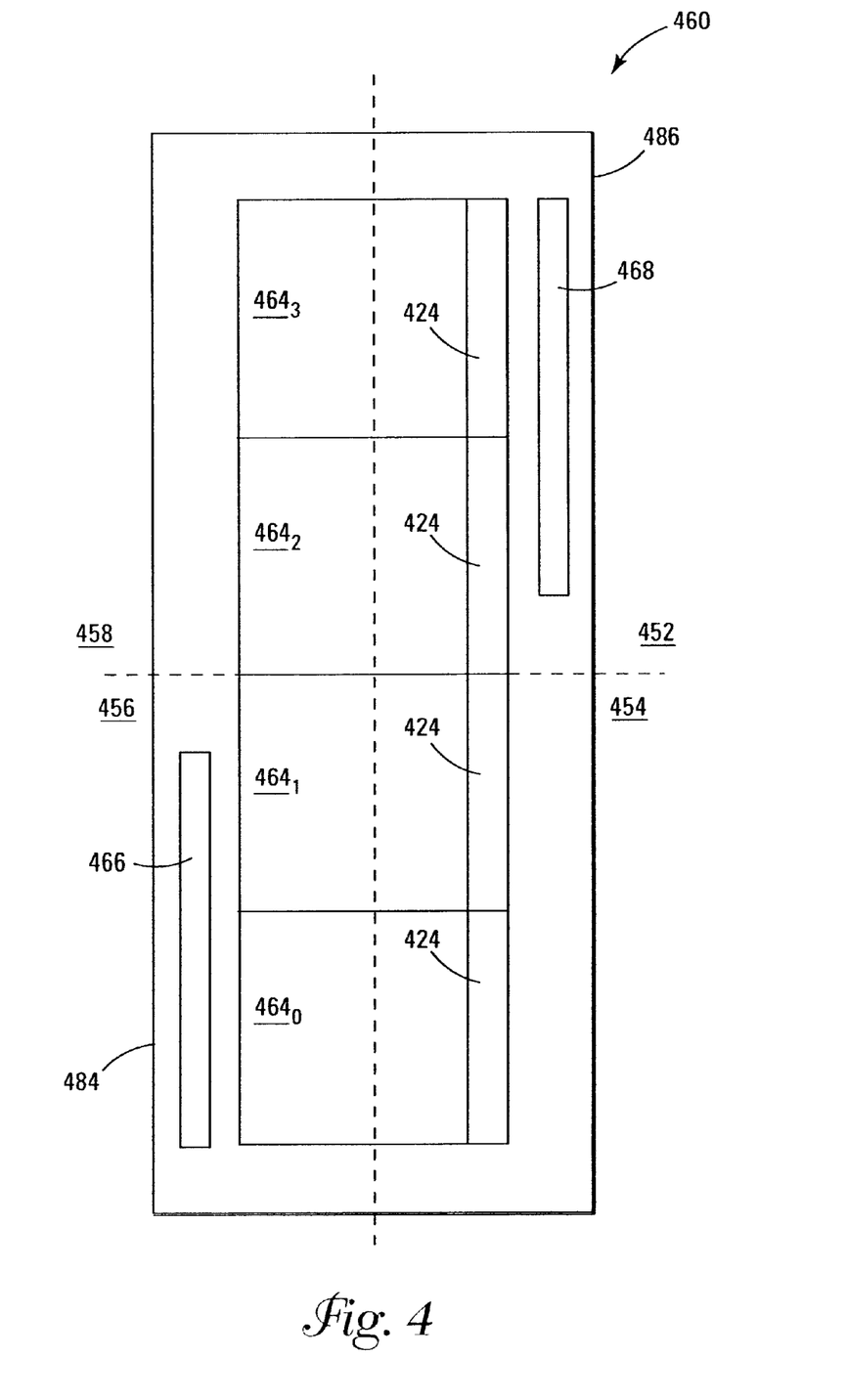
FIG. 4 is a schematic of a memory chip in accordance with the invention.

The memory banks of the various embodiments of the invention preferably have the same orientation. As one example, FIG. 4 depicts a simplified schematic of a memory chip 460 having four memory banks $464_0$–$464_3$. The memory banks 464 have the same orientation such that the I/O gating circuitry 424 of each memory bank 464 is located adjacent the same side of the memory chip 460. While the memory banks 464 have been shown as a substantially contiguous structure, there is no requirement that the memory banks 464 be physically adjoining. However, reducing spacing between the memory banks 464 may provide improvements in die efficiency. Memory chip 460 may contain a synchronous flash memory device as described with reference to FIG. 2. Memory chip 460 may alternatively contain other multiple-bank memory devices arranged as herein described.

The address chip bond pads 466 correspond to address pins of a memory package, such as interconnect pins A0–A11 and BA0–BA1 of the memory package 150, and are coupled to the address inputs of the memory device. The data chip bond pads 468 correspond to data I/O pins of a memory package, such as interconnect pins DQ0–DQ15 of the memory package 150, and are coupled to the data I/O of the memory device. The chip bond pads are fabricated on the substrate as part of the memory chip 460.

In the following discussion, various apparatus will be described in relation to four quadrants defined by the intersection of the major and minor axes of the apparatus. A quadrant will be referred to as opposite another quadrant when it is on the opposite side of both axes from the other quadrant. Likewise, a corner will be referred to as opposite another corer when it is in a quadrant opposite the quadrant containing the other corner.

The data chip bond pads 468 are located adjacent I/O gating circuitry 424 and a first side 486 of the memory chip 460. The data chip bond pads 468 are thus interposed between I/O gating circuitry 424 and the first side 486 for this embodiment. The data chip bond pads 486 are further located in the first quadrant 452 of memory chip 460. The address chip bond pads 466 are located adjacent the memory banks 464 and a second side 484 of the memory chip 460. The address chip bond pads are thus interposed between the memory banks 464 and the second side 484. The address chip bond pads 466 are further located in the third quadrant 456 of memory chip 460. The third quadrant 456 is opposite the first quadrant 452.

Clock and control signal chip bond pads, as well as power input chip bond pads, are not shown in FIG. 4. Clock and control signal chip bond pads are coupled to the memory device to provide timing and control to the command execution logic. Power input chip bond pads are coupled to the memory device to provide supply and ground potentials to the various circuitry of the memory device. For one embodiment, the clock and control signal chip bond pads are grouped with the address chip bond pads 466 in the third quadrant 456 while power input chip bond pads are grouped with both the address chip bond pads 466 in the third quadrant 456 and the data chip bond pads 468 in the first quadrant 452. Additional chip bond pads, such as additional power input chip bond pads or control signal chip bond pads, may be segregated from both the address chip bond pads 466 and the data chip bond pads 468. Such additional chip bond pads are located in the second quadrant 454 and/or the fourth quadrant 458. As one example, one or more power input chip bond pads may be located adjacent the second side 484 in the fourth quadrant 458 of memory chip 460, such as one of the VCC chip bond pads. As another example, one or more control signal chip bond pads may be located adjacent the first side 486 in the second quadrant 454 of memory chip 460, such as one of the RP# chip bond pads.

The memory chip 460 of FIG. 4 offers certain advantages. By aligning the I/0 gating circuitry 424 with the major axis of the memory chip 460, column select lines within the memory arrays need only traverse the arrays along the minor axis of the memory chip 460, thus assisting to reduce propagation delays in the data I/O path. Furthermore, aligning the major axis of the memory chip 460 with the major axis of a memory package permits more extensive use of the available space within the memory package, thus permitting increased memory densities within a memory package of fixed width.

To couple the chip bond pads of memory chip 460 to the pins of a memory package, an LOC (lead-over-chip) leadframe may be used. LOC leadframes are well known in the art of packaging semiconductor chips. LOC leadframes generally contain a pressure-sensitive adhesive portion for securing the chip and a plurality of conductive leads for coupling the chip bond pads to pins of a semiconductor package. As the general construction, alignment and use of such LOC leadframes is well known, the following discussion will be limited to those factors that are pertinent to the various embodiments of the invention.

Figure 5:
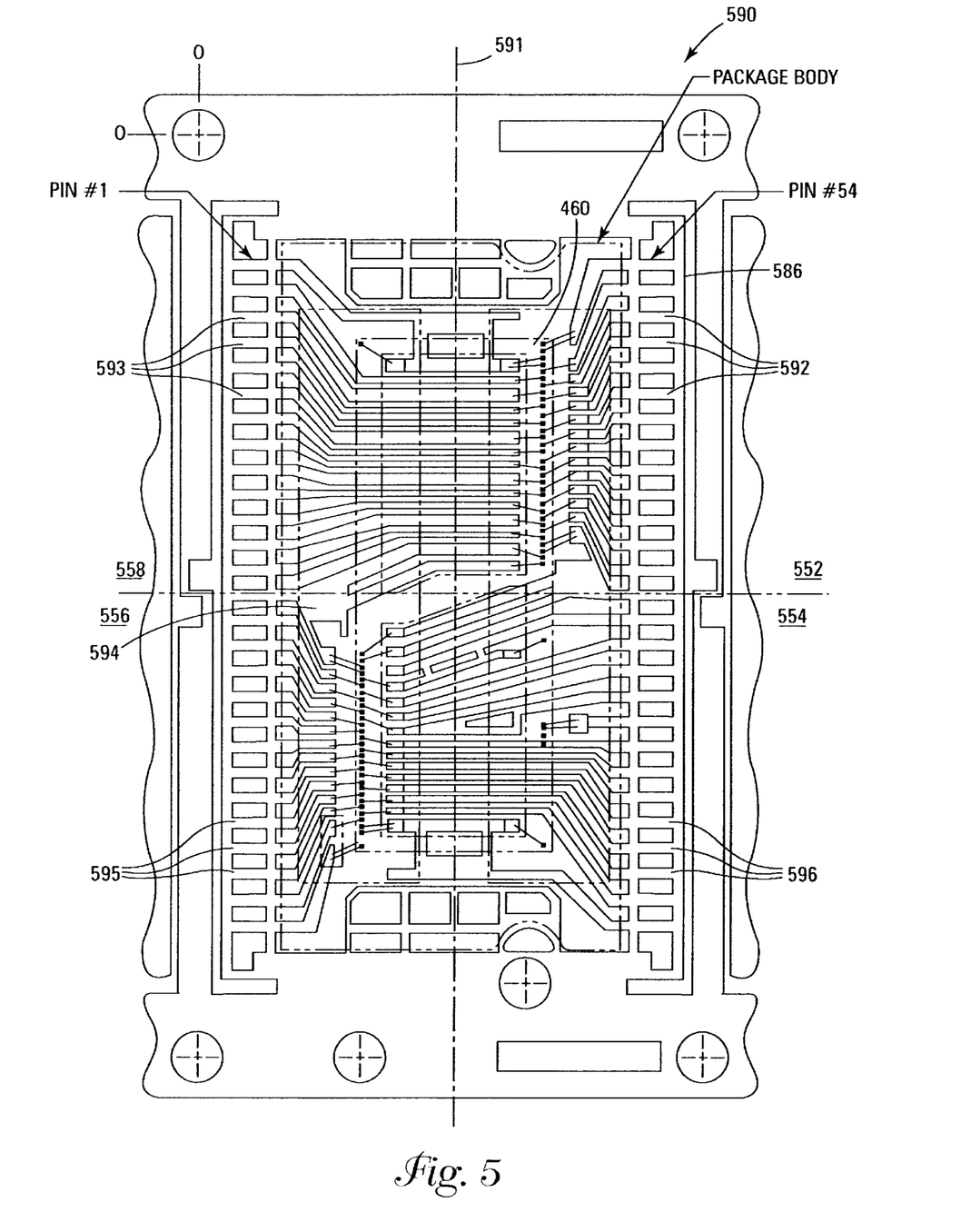
FIG. 5 is an assembly detail drawing of a lead-over-chip leadframe attached to a memory chip in accordance with the invention.

FIG. 5 is an assembly detail drawing showing attachment of a memory chip 460 to an LOC leadframe 590. As shown, the LOC leadframe 590 is adapted for coupling chip bond pads of memory chip 460 to the interconnect pins of memory package 150. Accordingly, the LOC leadframe 590 has leads having a one-to-one correspondence to the interconnect pins of memory package 150.

A first plurality of leads includes short leads, such as lead 592, extending from side 586 of the LOC leadframe 590 and originating in a first quadrant 552. The first plurality of leads corresponds to data pins on side 176 of the memory package 150. The term "short" as used herein does not directly relate to physical length. As used herein, a lead is short if it terminates between a centerline 591 of the LOC leadframe 590 and the side from which it extends. Stated alternatively, a lead is short if it terminates in the same quadrant from which it originates. A second plurality of leads includes long leads, such as leads 593, extending from side 584 of the LOC leadframe 590 and originating in a fourth quadrant 558. The second plurality of leads corresponds to data pins on side 174 of the memory package 150. The term "long" as used herein does not directly relate to physical length. As used herein, a lead is long if it terminates between the centerline 591 of the LOC leadframe 590 and the side opposite from which it extends. Stated alternatively, a lead is long if it terminates in a quadrant other than the quadrant from which it originates. Furthermore a lead is a composite lead, such as leads 594, if it is a composite of short and long leads and thus has terminations on each side of the centerline 591 or in multiple quadrants. A detailed discussion of composite leads is included in U.S. patent application Ser. No. 09/648,880 filed Aug. 25, 2000 and titled, "Memory Device Power Distribution Using LOC Leadframe," which is commonly assigned.

A third plurality of leads includes short leads, such as leads 595, extending from the side 584 of the LOC leadframe 590 and originating in the third quadrant 556. The third plurality of leads corresponds to address pins on side 174 of the memory package 150. A fourth plurality of leads includes long leads, such as leads 596, extending from the side 586 of the LOC leadframe 590 and originating in the second quadrant 554. The fourth plurality of leads corresponds to address pins on side 176 of the memory package 150. Additional leads of the plurality of leads correspond to clock and control signal pins as well as power input pins as is apparent from viewing FIG. 5 with reference to FIG. 3.

For one embodiment, there is one VCCQ and one VSSQ power input chip bond pad for every four data chip bond pads. For higher performance and reduction of signal noise, the VCCQ and VSSQ power input chip bond pads should be placed as close to the data chip bond pads as possible in order to minimize the power bus metal resistance. The various embodiments of the invention help facilitate placement of VCCQ and VSSQ power input chip bond pads near and throughout the data chip bond pads, even for long and narrow chips.

As shown in the embodiment of FIG. 5, most of the chip bond pads, including all of the address chip bond pads and the data chip bond pads, are arranged in two rows. Each of the two rows of chip bond pads is arranged substantially parallel to the sides and major axis of the memory chip and extends from a corner of the memory chip toward a center of its associated side. Although the rows of chip bond pads in the embodiment of FIG. 5 are substantially in-line, a row of chip bond pads may contain chip bond pads in a staggered relationship. For one embodiment, one of the rows of chip bond pads extends toward and beyond the center of its associated side such as to be located in more than one quadrant. For another embodiment, each data chip bond pad of the memory chip is located in a first quadrant of the memory chip while each address chip bond pad of the memory chip is located in a quadrant of the memory chip opposite the first quadrant.

While advantages may be obtained in arranging the memory banks to have the same orientation, as described above, such arrangement is not a requirement. For a further embodiment, a memory chip may contain two or more memory banks having differing orientations. As one example, a memory chip may contain two memory banks having their I/O gating circuitry on one side of the major axis of the memory chip and two memory banks having their I/O gating circuitry on the other side of the major axis of the memory chip.

CONCLUSION

Various embodiments of the invention have been shown for providing operational advantages in semiconductor memory devices through architecture, packaging orientation and assembly. The various embodiments of the invention include memory chips containing multiple-bank memory devices arranged to be mounted in a memory package with the major axis of the memory chip aligned substantially parallel with the major axis of its memory package. Memory devices of various embodiments contain banks of non-volatile flash memory cells and have access commands synchronized to a system clock.

The memory chips of the various embodiments contain data chip bond pads for coupling to data pins of a memory package and address chip bond pads for coupling to address pins of the memory package. Data chip bond pads are located adjacent a first side of the memory chip substantially parallel to the major axis of the memory chip, and in a first quadrant of the memory chip. Address chip bond pads are located adjacent a side of the memory chip opposite the first side, and in a quadrant opposite the first quadrant. For memory chips of certain embodiments, each data chip bond pad of the memory chip is located in the first quadrant and each address chip bond pad of the memory chip is located in the quadrant opposite the first quadrant.

The memory chips of certain embodiments contain memory banks having the same orientation. Accordingly, the I/O gating circuitry of each memory bank is located adjacent the same side of the memory chip. Data chip bond pads for coupling to data pins of a memory package are located adjacent I/O gating circuitry in a first quadrant of the memory chip. Address chip bond pads for coupling to address pins of the memory package are located in an opposite quadrant of the memory chip. The memory chips of the various embodiments may contain synchronous flash memory devices.

LOC leadframes may be used to couple the chip bond pads to the pins of the memory package to produce an integrated circuit memory assembly. LOC leadframes in accordance with the invention contain a plurality of short leads for coupling data chip bond pads to data pins on a first side of the memory package; a plurality of long leads for coupling data chip bond pads to data pins on a second side of the memory package; a plurality of short leads for coupling address chip bond pads to address pins on the second side of the memory package; and a plurality of long leads for coupling address chip bond pads to address pins on the first side of the memory package.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A synchronous flash memory chip, comprising:
   a plurality of memory banks containing non-volatile flash memory cells, wherein the plurality of memory banks have the same orientation and wherein each of the plurality of memory banks has input/output gating circuitry located adjacent a first side of the memory chip;
   a command execution logic coupled to the plurality of memory banks for receiving at least a system clock input signal and for generating commands to control operations performed on the plurality of memory banks, wherein the commands are synchronized to the system clock input signal;
   a plurality of data inputs/outputs coupled to the plurality of memory banks;
   a plurality of address inputs coupled to the plurality of memory banks;
   a plurality of data chip bond pads coupled to the plurality of data inputs/outputs and interposed between the input/output gating circuitry and the first side of the memory chip in a first quadrant of the memory chip; and
   a plurality of address chip bond pads coupled to the plurality of address inputs and located adjacent a second side of the memory chip opposite the first side and in a third quadrant of the memory chip opposite the first quadrant.

2. The synchronous flash memory chip of claim 1, further comprising:
   a plurality of clock and control signal chip bond pads coupled to the command execution logic and grouped with the plurality of address chip bond pads;
   a first plurality of power input chip bond pads grouped with the plurality of data chip bond pads; and
   a second plurality of power input chip bond pads grouped with the plurality of address chip bond pads.

3. The synchronous flash memory chip of claim 2, further comprising:
   at least one control signal chip bond pad located in a quadrant of the synchronous memory chip selected from the group consisting of a second quadrant and a fourth quadrant.

4. A synchronous flash memory chip, comprising:
   a substrate having a memory device fabricated thereon, wherein the memory device comprises:
      a plurality of memory banks containing non-volatile flash memory cells and having a plurality of address inputs and a plurality of data inputs/outputs; and
      a command execution logic for receiving at least a system clock input signal and for generating commands to control operations performed on the plurality of memory banks, wherein the commands are synchronized to the system clock input signal;
   a first row of chip bond pads fabricated on the substrate in a first end and on a first side of the memory chip; and
   a second row of chip bond pads fabricated on the substrate in a second end of the memory chip opposite the first end and on a second side of the memory chip opposite the first side;
   wherein each of the plurality of data inputs/outputs is coupled to a chip bond pad in the first row of chip bond pads; and
   wherein each of the plurality of address inputs is coupled to a chip bond pad in the second row of chip bond pads.

5. A synchronous flash memory chip, comprising:
   a substrate having a memory device fabricated thereon, wherein the memory device comprises:
      a plurality of memory banks containing non-volatile flash memory cells and having a plurality of address inputs and a plurality of data inputs/outputs; and
      a command execution logic for receiving at least a system clock input signal and for generating commands to control operations performed on the plurality of memory banks, wherein the commands are synchronized to the system clock input signal;
   a first row of chip bond pads fabricated on the substrate and extending from a first corner of the memory chip toward a center of a first side of the memory chip; and
   a second row of chip bond pads fabricated on the substrate and extending from a second corner of the memory chip toward a center of a second side of the memory chip, wherein the second corner is opposite the first corner and the second side is opposite the first side;
   wherein each of the plurality of data inputs/outputs is coupled to a chip bond pad in the first row of chip bond pads; and
   wherein each of the plurality of address inputs is coupled to a chip bond pad in the second row of chip bond pads.

6. A synchronous flash memory assembly, comprising:
   a memory package having a plurality of interconnect pins, wherein the plurality of interconnect pins comprises a first plurality of data pins located on a first side of the memory package, a second plurality of data pins located on a second side of the memory package, a first plurality of address pins located on the first side of the memory package, and a second plurality of address pins located on the second side of the memory package, further wherein each plurality of data pins is segregated from each plurality of address pins;
   a lead-over-chip leadframe having a plurality of leads coupled to the plurality of interconnect pins in a one-to-one relationship; and
   a synchronous flash memory chip, comprising:
      a plurality of memory banks containing non-volatile flash memory cells, wherein the plurality of memory banks have the same orientation and wherein each of the plurality of memory banks has input/output gating circuitry located adjacent a first side of the memory chip;
      a command execution logic coupled to the plurality of memory banks for receiving at least a system clock input signal and for generating commands to control operations performed on the plurality of memory banks, wherein the commands are synchronized to the system clock input signal;
      a plurality of data inputs/outputs coupled to the plurality of memory banks;
      a plurality of address inputs coupled to the plurality of memory banks;
      a plurality of data chip bond pads coupled to the plurality of data inputs/outputs and interposed between the input/output gating circuitry and the first side of the memory chip in a first quadrant of the memory chip; and
      a plurality of address chip bond pads coupled to the plurality of address inputs and located adjacent a second side of the memory chip opposite the first side and in a third quadrant of the memory chip opposite the first quadrant;

wherein a first portion of the plurality of data chip bond pads is coupled to the first plurality of data pins through leads of the leadframe;

wherein a remaining portion of the plurality of data chip bond pads is coupled to the second plurality of data pins through leads of the leadframe;

wherein a first portion of the plurality of address chip bond pads is coupled to the first plurality of address pins through leads of the leadframe; and wherein a remaining portion of the plurality of address chip bond pads is coupled to the second plurality of address pins through leads of the leadframe.

7. A synchronous flash memory assembly, comprising:

a memory package having a plurality of interconnect pins, wherein the plurality of interconnect pins comprises a first plurality of data pins located on a first side of the memory package, a second plurality of data pins located on a second side of the memory package, a first plurality of address pins located on the first side of the memory package, and a second plurality of address pins located on the second side of the memory package, further wherein each plurality of data pins is segregated from each plurality of address pins;

a lead-over-chip leadframe having a plurality of leads coupled to the plurality of interconnect pins in a one-to-one relationship; and a synchronous flash memory chip, comprising:
a substrate having a memory device fabricated thereon, wherein the memory device comprises:
a plurality of memory banks containing non-volatile flash memory cells and having a plurality of address inputs and a plurality of data inputs/outputs; and
a command execution logic for receiving at least a system clock input signal and for generating commands to control operations performed on the plurality of memory banks, wherein the commands are synchronized to the system clock input signal;
a first row of chip bond pads fabricated on the substrate in a first end and on a first side of the memory chip; and
a second row of chip bond pads fabricated on the substrate in a second end of the memory chip opposite the first end and on a second side of the memory chip opposite the first side;
wherein each of the plurality of data inputs/outputs is coupled to a chip bond pad in the first row of chip bond pads; and
wherein each of the plurality of address inputs is coupled to a chip bond pad in the second row of chip bond pads;

wherein a first portion of the first row of chip bond pads is coupled to the first plurality of data pins through leads of the leadframe;

wherein a second portion of the first row of chip bond pads is coupled to the second plurality of data pins through leads of the leadframe;

wherein a first portion of the second row of chip bond pads is coupled to the first plurality of address pins through leads of the leadframe; and wherein a second portion of the second row of chip bond pads is coupled to the second plurality of address pins through leads of the leadframe.

8. A synchronous flash memory assembly, comprising:

a memory package having a plurality of interconnect pins, wherein the plurality of interconnect pins comprises a first plurality of data pins located on a first side of the memory package, a second plurality of data pins located on a second side of the memory package, a first plurality of address pins located on the first side of the memory package, and a second plurality of address pins located on the second side of the memory package, further wherein each plurality of data pins is segregated from each plurality of address pins;

a lead-over-chip leadframe having a plurality of leads coupled to the plurality of interconnect pins in a one-to-one relationship; and a synchronous flash memory chip, comprising:
a substrate having a memory device fabricated thereon, wherein the memory device comprises:
a plurality of memory banks containing non-volatile flash memory cells and having a plurality of address inputs and a plurality of data inputs/outputs; and
a command execution logic for receiving at least a system clock input signal and for generating commands to control operations performed on the plurality of memory banks, wherein the commands are synchronized to the system clock input signal;
a first row of chip bond pads fabricated on the substrate and extending from a first corner of the memory chip toward a center of a first side of the memory chip; and
a second row of chip bond pads fabricated on the substrate and extending from a second corner of the memory chip toward a center of a second side of the memory chip, wherein the second corner is opposite the first corner and the second side is opposite the first side;
wherein each of the plurality of data inputs/outputs is coupled to a chip bond pad in the first row of chip bond pads; and
wherein each of the plurality of address inputs is coupled to a chip bond pad in the second row of chip bond pads;

wherein a first portion of the first row of chip bond pads is coupled to the first plurality of data pins through leads of the leadframe;

wherein a second portion of the first row of chip bond pads is coupled to the second plurality of data pins through leads of the leadframe;

wherein a first portion of the second row of chip bond pads is coupled to the first plurality of address pins through leads of the leadframe; and wherein a second portion of the second row of chip bond pads is coupled to the second plurality of address pins through leads of the leadframe.

9. A synchronous flash memory assembly, comprising:

a memory package having a plurality of interconnect pins having a pin layout substantially similar to an industry-standard SDRAM layout, wherein the plurality of interconnect pins comprises data pins and address pins;

a lead-over-chip leadframe having a plurality of leads coupled to the plurality of interconnect pins in a one-to-one relationship; and a synchronous flash memory chip, comprising:
a plurality of memory banks containing non-volatile flash memory cells, wherein the plurality of memory banks have the same orientation and wherein each of the plurality of memory banks has input/output gating circuitry located adjacent a first side of the memory chip;

a command execution logic coupled to the plurality of memory banks for receiving at least a system clock input signal and for generating commands to control operations performed on the plurality of memory banks, wherein the commands are synchronized to the system clock input signal;

a plurality of data inputs/outputs coupled to the plurality of memory banks;

a plurality of address inputs coupled to the plurality of memory banks;

a plurality of data chip bond pads coupled to the plurality of data inputs/outputs and interposed between the input/output gating circuitry and the first side of the memory chip in a first quadrant of the memory chip; and a plurality of address chip bond pads coupled to the plurality of address inputs and located adjacent a second side of the memory chip opposite the first side and in a third quadrant of the memory chip opposite the first quadrant;

wherein a first portion of the plurality of data chip bond pads is coupled to data pins of a first side of the memory package through leads of the leadframe;

wherein a remaining portion of the plurality of data chip bond pads is coupled to data pins of a second side of the memory package through leads of the leadframe;

wherein a first portion of the plurality of address chip bond pads is coupled to address pins of the first side of the memory package through leads of the leadframe; and wherein a remaining portion of the plurality of address chip bond pads is coupled to address pins of the second side of the memory package through leads of the leadframe.

10. A synchronous flash memory assembly, comprising:

a memory package having a plurality of interconnect pins having a pin layout substantially similar to an industry-standard SDRAM layout, wherein the plurality of interconnect pins comprises data pins and address pins;

a lead-over-chip leadframe having a plurality of leads coupled to the plurality of interconnect pins in a one-to-one relationship; and a synchronous flash memory chip, comprising:
   a substrate having a memory device fabricated thereon, wherein the memory device comprises:
      a plurality of memory banks containing non-volatile flash memory cells and having a plurality of address inputs and a plurality of data inputs/outputs; and
      a command execution logic for receiving at least a system clock input signal and for generating commands to control operations performed on the plurality of memory banks, wherein the commands are synchronized to the system clock input signal;
   a first row of chip bond pads fabricated on the substrate in a first end and on a first side of the memory chip; and
   a second row of chip bond pads fabricated on the substrate in a second end of the memory chip opposite the first end and on a second side of the memory chip opposite the first side;
   wherein each of the plurality of data inputs/outputs is coupled to a chip bond pad in the first row of chip bond pads; and
   wherein each of the plurality of address inputs is coupled to a chip bond pad in the second row of chip bond pads;

wherein a first portion of the first row of chip bond pads is coupled to data pins of a first side of the memory package through leads of the leadframe;

wherein a second portion of the first row of chip bond pads is coupled to data pins of a second side of the memory package through leads of the leadframe;

wherein a first portion of the second row of chip bond pads is coupled to address pins of the first side of the memory package through leads of the leadframe; and wherein a second portion of the second row of chip bond pads is coupled to address pins of the second side of the memory package through leads of the leadframe.

11. A synchronous flash memory assembly, comprising:

a memory package having a plurality of interconnect pins having a pin layout substantially similar to an industry-standard SDRAM layout, wherein the plurality of interconnect pins comprises data pins and address pins;

a lead-over-chip leadframe having a plurality of leads coupled to the plurality of interconnect pins in a one-to-one relationship; and a synchronous flash memory chip, comprising:
   a substrate having a memory device fabricated thereon, wherein the memory device comprises:
      a plurality of memory banks containing non-volatile flash memory cells and having a plurality of address inputs and a plurality of data inputs/outputs; and
      a command execution logic for receiving at least a system clock input signal and for generating commands to control operations performed on the plurality of memory banks, wherein the commands are synchronized to the system clock input signal;
   a first row of chip bond pads fabricated on the substrate and extending from a first corner of the memory chip toward a center of a first side of the memory chip; and
   a second row of chip bond pads fabricated on the substrate and extending from a second corner of the memory chip toward a center of a second side of the memory chip, wherein the second corner is opposite the first corner and the second side is opposite the first side;
   wherein each of the plurality of data inputs/outputs is coupled to a chip bond pad in the first row of chip bond pads; and
   wherein each of the plurality of address inputs is coupled to a chip bond pad in the second row of chip bond pads;

wherein a first portion of the first row of chip bond pads is coupled to data pins of a first side of the memory package through leads of the leadframe;

wherein a second portion of the first row of chip bond pads is coupled to data pins of a second side of the memory package through leads of the leadframe;

wherein a first portion of the second row of chip bond pads is coupled to address pins of the first side of the memory package through leads of the leadframe; and wherein a second portion of the second row of chip bond pads is coupled to address pins of the second side of the memory package through leads of the leadframe.

12. A synchronous flash memory chip, comprising:

a plurality of memory banks containing non-volatile flash memory cells;

a command execution logic coupled to the plurality of memory banks for receiving at least a system clock input signal and for generating commands to control operations performed on the plurality of memory banks, wherein the commands are synchronized to the system clock input signal;

a plurality of data inputs/outputs coupled to the plurality of memory banks;

a plurality of address inputs coupled to the plurality of memory banks;

a plurality of data chip bond pads coupled to the plurality of data inputs/outputs and located adjacent a first side of the memory chip in a first quadrant of the memory chip; and a plurality of address chip bond pads coupled to the plurality of address inputs and located adjacent a side of the memory chip opposite the first side and in a quadrant of the memory chip opposite the first quadrant;

wherein each data chip bond pad of the synchronous flash memory chip is located in the first quadrant of the synchronous flash memory chip; and wherein each address chip bond pad of the synchronous flash memory chip is located in the quadrant of the synchronous flash memory chip opposite the first quadrant.

13. A synchronous flash memory assembly, comprising:

a memory package having a plurality of interconnect pins, wherein the plurality of interconnect pins comprises a first plurality of data pins located on a first side of the memory package, a second plurality of data pins located on a second side of the memory package, a first plurality of address pins located on the first side of the memory package, and a second plurality of address pins located on the second side of the memory package, further wherein each plurality of data pins is segregated from each plurality of address pins;

a lead-over-chip leadframe having a plurality of leads coupled to the plurality of interconnect pins in a one-to-one relationship; and a synchronous flash memory chip, comprising:
  a plurality of memory banks containing non-volatile flash memory cells;
  a command execution logic coupled to the plurality of memory banks for receiving at least a system clock input signal and for generating commands to control operations performed on the plurality of memory banks, wherein the commands are synchronized to the system clock input signal;
  a plurality of data inputs/outputs coupled to the plurality of memory banks;
  a plurality of address inputs coupled to the plurality of memory banks;
  a plurality of data chip bond pads coupled to the plurality of data inputs/outputs and located adjacent a first side of the memory chip in a first quadrant of the memory chip; and
  a plurality of address chip bond pads coupled to the plurality of address inputs and located adjacent a side of the memory chip opposite the first side and in a quadrant of the memory chip opposite the first quadrant;

wherein a first portion of the plurality of data chip bond pads is coupled to the first plurality of data pins through leads of the leadframe;

wherein a remaining portion of the plurality of data chip bond pads is coupled to the second plurality of data pins through leads of the leadframe;

wherein a first portion of the plurality of address chip bond pads is coupled to the first plurality of address pins through leads of the leadframe;

wherein a remaining portion of the plurality of address chip bond pads is coupled to the second plurality of address pins through leads of the leadframe;

wherein each data chip bond pad of the synchronous flash memory chip is located in the first quadrant of the synchronous flash memory chip; and wherein each address chip bond pad of the synchronous flash memory chip is located in the quadrant of the synchronous flash memory chip opposite the first quadrant.

14. An electronic system, comprising:

a processor; and a synchronous flash memory device coupled to the processor, wherein the synchronous flash memory device comprises:
  a plurality of memory banks containing non-volatile flash memory cells, wherein the plurality of memory banks have the same orientation and wherein each of the plurality of memory banks has input/output gating circuitry located adjacent a first side of the memory chip;
  a command execution logic coupled to the plurality of memory banks for receiving at least a system clock input signal and for generating commands to control operations performed on the plurality of memory banks, wherein the commands are synchronized to the system clock input signal;
  a plurality of data inputs/outputs coupled between the processor and the plurality of memory banks;
  a plurality of address inputs coupled between the processor and the plurality of memory banks;
  a plurality of data chip bond pads coupled to the plurality of data inputs/outputs and interposed between the input/output gating circuitry and the first side of the memory chip in a first quadrant of the memory chip; and
  a plurality of address chip bond pads coupled to the plurality of address inputs and located adjacent a second side of the memory chip opposite the first side and in a third quadrant of the memory chip opposite the first quadrant.

* * * * *